(12) United States Patent
Illek et al.

(10) Patent No.: US 9,548,433 B2
(45) Date of Patent: Jan. 17, 2017

(54) LIGHT-EMITTING DIODE CHIP

(75) Inventors: Stefan Illek, Donaustauf (DE); Ulrich Steegmüller, Regensburg (DE); Norwin von Malm, Nittendorf (DE)

(73) Assignee: OSRAM Opto Semiconductors GmbH (DE)

( * ) Notice: Subject to any disclaimer, the term of this patent is extended or adjusted under 35 U.S.C. 154(b) by 413 days.

(21) Appl. No.: 13/878,673

(22) PCT Filed: Sep. 28, 2011

(86) PCT No.: PCT/EP2011/066873
§ 371 (c)(1),
(2), (4) Date: Jun. 24, 2013

(87) PCT Pub. No.: WO2012/049023
PCT Pub. Date: Apr. 19, 2012

(65) Prior Publication Data
US 2013/0299867 A1    Nov. 14, 2013

(30) Foreign Application Priority Data
Oct. 11, 2010   (DE) .................... 10 2010 048 159

(51) Int. Cl.
*H01L 31/12*   (2006.01)
*H01L 33/62*   (2010.01)
*H01L 27/15*   (2006.01)

(52) U.S. Cl.
CPC ............. *H01L 33/62* (2013.01); *H01L 27/153* (2013.01); *H01L 2224/48463* (2013.01)

(58) Field of Classification Search
CPC .......... H01L 31/12; H01L 33/48; H01L 33/62
See application file for complete search history.

(56) References Cited

U.S. PATENT DOCUMENTS

| 7,265,392 B2 | 9/2007 | Hahn et al. | |
| 2003/0168664 A1 | 9/2003 | Hahn et al. | |
| 2003/0178627 A1* | 9/2003 | Marchl et al. | 257/80 |

(Continued)

FOREIGN PATENT DOCUMENTS

| DE | 10 2008 011 848 A1 | 9/2009 |
| DE | 10 2008 051 050 A1 | 4/2010 |

(Continued)

OTHER PUBLICATIONS

Hsieh, C., "Epistar's Chips Plug and Play," *Compound Semiconductor*, Jun. 2009, vol. 15, No. 4, pp. 18-20.

(Continued)

*Primary Examiner* — Jae Lee
(74) *Attorney, Agent, or Firm* — DLA Piper LLP (US)

(57) ABSTRACT

A light-emitting diode chip includes at least two semiconductor bodies, each semiconductor body including at least one active area that generates radiation, a carrier having a top side and an underside facing away from the top side, and an electrically insulating connector arranged at the top side of the carrier, wherein the electrically insulating connector is arranged between the semiconductor bodies and the top side of the carrier, the electrically insulating connector imparts a mechanical contact between the semiconductor bodies and the carrier, and at least some of the semiconductor bodies electrically connect in series with one another.

15 Claims, 4 Drawing Sheets

(56) References Cited

U.S. PATENT DOCUMENTS

| | | |
|---|---|---|
| 2005/0062049 A1 | 3/2005 | Lin et al. |
| 2010/0078656 A1* | 4/2010 | Seo et al. .................. 257/88 |
| 2010/0155746 A1* | 6/2010 | Ibbetson et al. ............ 257/88 |
| 2010/0163887 A1 | 7/2010 | Kim et al. |
| 2011/0049537 A1* | 3/2011 | Lee .................... H01L 25/0753 257/88 |

FOREIGN PATENT DOCUMENTS

| | | |
|---|---|---|
| DE | 10 2010 013 494 A1 | 10/2011 |
| TW | 201001753 A1 | 1/2010 |
| WO | 2009/106063 A1 | 9/2009 |
| WO | 2009/140947 | 11/2009 |

OTHER PUBLICATIONS

Examination Report issued in corresponding Taiwanese Patent Application No. 100136391 dated Sep. 13, 2013.

German version of Office Action dated Mar. 25, 2015 of corresponding Chinese Application No. 201180049221.2 with English translation.

English translation of the Second Office Action dated Nov. 30, 2015 of corresponding Chinese Application No. 201180049221.2.

\* cited by examiner

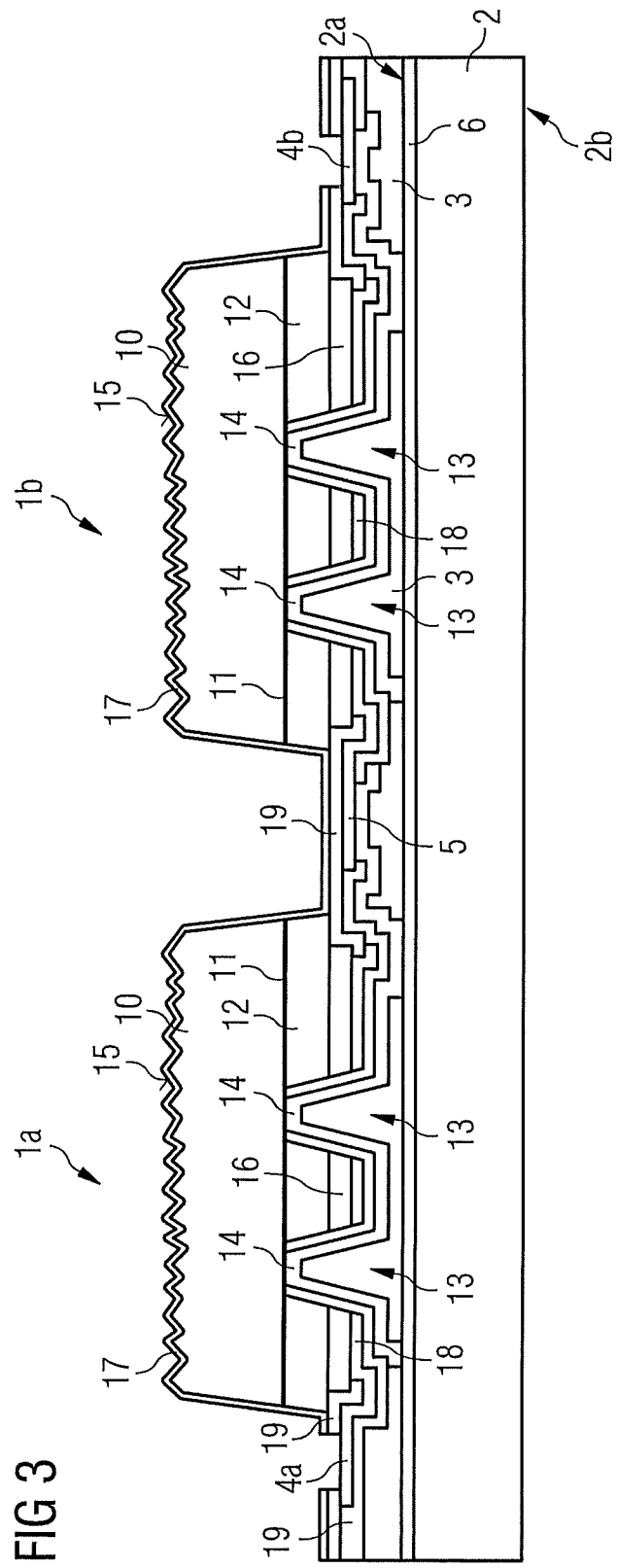

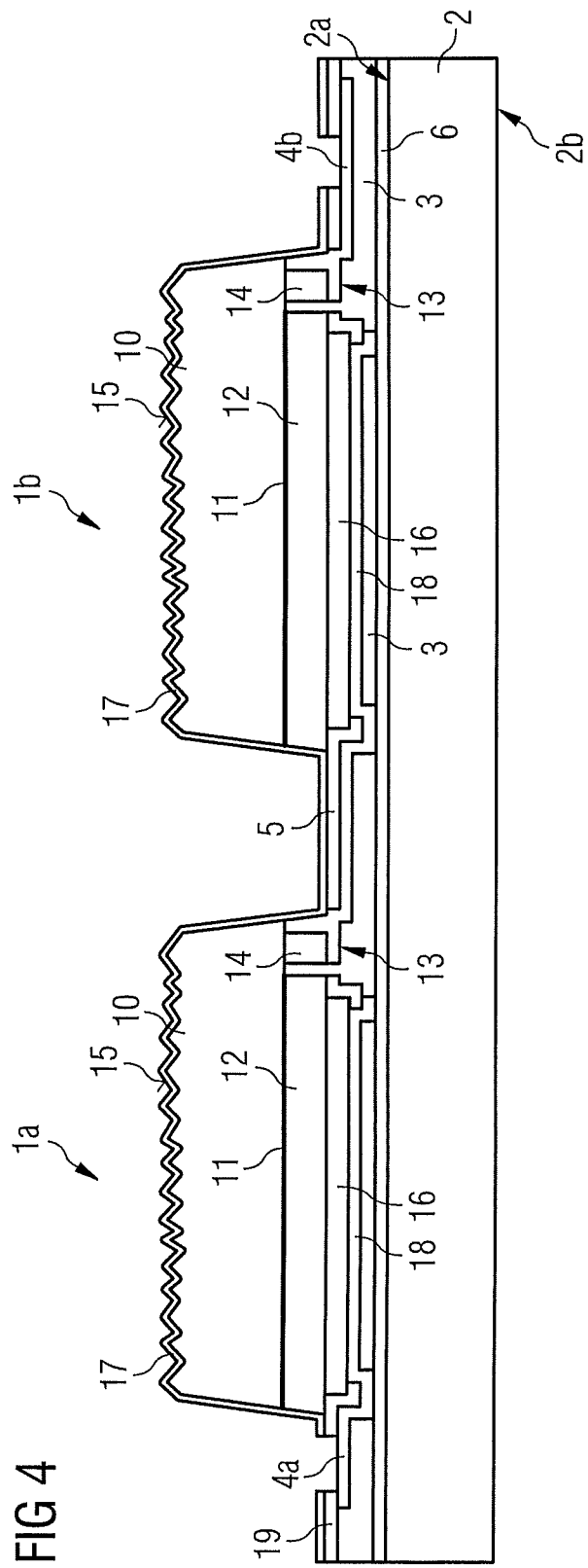

LIGHT-EMITTING DIODE CHIP

TECHNICAL FIELD

This disclosure relates to light-emitting diode chips.

BACKGROUND

U.S. Pat. No. 7,265,392 describes a light-emitting diode chip. There is a need, however, to provide a light-emitting diode chip which has an increased lifetime.

SUMMARY

We provide a light-emitting diode chip including at least two semiconductor bodies, each semiconductor body including at least one active region that generates radiation, a carrier having a top side and an underside facing away from the top side, and an electrically insulating connector arranged at the top side of the carrier, wherein the electrically insulating connector is arranged between the semiconductor bodies and the top side of the carrier, the electrically insulating connector imparts a mechanical contact between the semiconductor bodies and the carrier, and at least some of the semiconductor bodies electrically connect in series with one another.

We also provide a light-emitting diode chip including at least two semiconductor bodies, each including at least one active region that generates radiation, a carrier having a top side and an underside facing away from the top side, an electrically insulating connector arranged at the top side of the carrier, and an electrically insulating layer arranged between the electrically insulating connector and the top side of the carrier, wherein the electrically insulating connector is arranged between the semiconductor bodies and the top side of the carrier, the electrically insulating connector imparts a mechanical contact between the semiconductor bodies and the carrier, at least some of the semiconductor bodies electrically connect in series with one another, the electrically insulating layer is planar, and the electrically insulating layer directly adjoins the carrier and the electrically insulating connector.

BRIEF DESCRIPTION OF THE DRAWINGS

FIG. 3 shows a schematic sectional illustration of a light-emitting diode chip in accordance with a third example.

FIG. 4 shows a schematic sectional illustration of a light-emitting diode chip in accordance with a fourth example.

DETAILED DESCRIPTION

Figure 1:
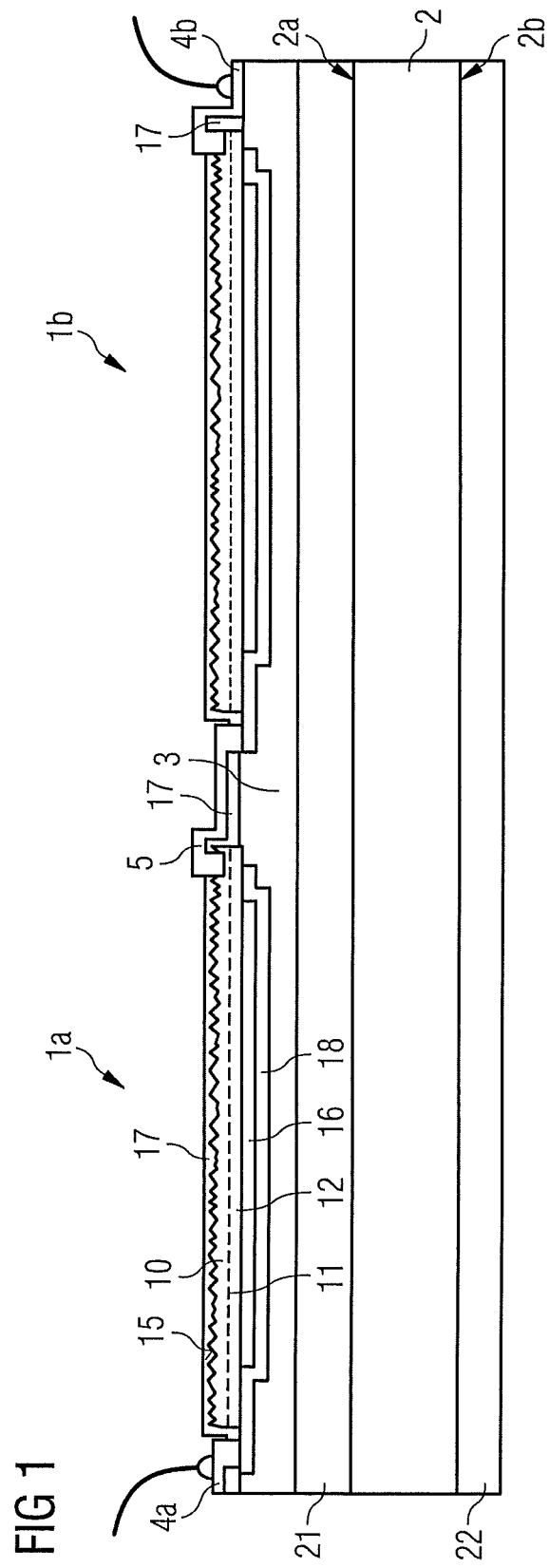
FIG. 1 shows a schematic sectional illustration of a light-emitting diode chip in accordance with a first example.

Our light-emitting diode chip may comprise at least two semiconductor bodies, wherein each semiconductor body of the light-emitting diode chip may comprise at least one active region configured to generate radiation. In this case, the semiconductor bodies of the light-emitting diode chip may be separated from one another and spaced apart from one another. That is to say that the semiconductor bodies may, in particular, not be connected to one another by a semiconductor layer epitaxially grown jointly with the semiconductor bodies. In this way, in particular, the active regions of the semiconductor bodies configured to generate radiation may also be separated from one another and spaced apart from one another.

In this case, each semiconductor body comprises at least one active region configured to generate radiation. If the semiconductor body comprises a plurality of active regions configured to generate radiation, the active regions are arranged one above another, for example, in a growth direction of the semiconductor body. The active regions are configured, for example, to generate electromagnetic radiation in the frequency range between infrared radiation and UV radiation, for example, visible light.

In this case, the semiconductor bodies of the light-emitting diode chip can be constructed in an identical way within the scope of production tolerance. In particular, it is possible for the semiconductor bodies of the light-emitting diode chip to originate from the same wafer, that is to say to be manufactured jointly.

The semiconductor bodies of the light-emitting diode chip can be formed, for example, with a III/V compound semiconductor material. A III/V compound semiconductor material comprises at least one element from the third main group such as, for example, B, Al, Ga, In, and an element from the fifth main group such as, for example, N, P, As. In particular, the term "III/V compound semiconductor material" encompasses the group of binary, ternary or quaternary compounds containing at least one element from the third main group and at least one element from the fifth main group, for example, nitride and phosphide compound semiconductors. Such a binary, ternary or quaternary compound can additionally comprise, for example, one or more dopants and additional constituents.

The light-emitting diode chip may comprise a carrier having a top side and an underside facing away from the top side. The top side of the carrier serves, for example, to receive components of the light-emitting diode chip such as the semiconductor bodies of the light-emitting diode chip. With its underside facing away from the top side, the carrier can be fixed, for example, onto a connection carrier or a leadframe. The area at the underside of the carrier then forms the mounting area of the light-emitting diode chip.

In this case, the carrier can be formed from an electrically insulating or an electrically conducting material. Preferably, the carrier is distinguished by a high thermal conductivity. The carrier can be formed, for example, with a ceramic material or with a metallic material. By way of example, the carrier contains at least one or the carrier consists of at least one of the following materials: $Al_2O_3$, $Si_3N_4$, AlN, Cu, Ni, Mo, W, Ag, Al.

The light-emitting diode chip may comprise an electrically insulating connector arranged at the top side of the carrier. The electrically insulating connector then preferably covers the carrier at its top side completely or at least for the most part. By way of example, at least 90% of the area at the top side of the carrier is covered with the electrically insulating connector.

In this case, the electrically insulating connector can directly adjoin the carrier. Furthermore, it is possible for one or further layers to be arranged between the electrically insulating connector and the carrier.

To form the electrically insulating connector, in particular the following materials or combinations and mixtures of the following materials are suitable: silicone resin, epoxy resin, acrylates, polyethanes, polyesters, polythioesters, spin-on-glass, nanoparticle sols. The nanoparticle sols can be formed, for example, with particles of the following materials: $SiO_2$, $TiO_2$, $Ta_2O5$, $Al_2O_3$, $Si_4N_3$, AlN. Furthermore, other metal oxides or metal nitrides can be appropriate to form the nanoparticles. To form the electrically insulating connector, however, use is preferably made of materials which can be cured at the lowest possible temperature, for example, silicone resins, epoxy resins or acrylates.

The electrically insulating connector may be arranged between the semiconductor bodies and the top side of the carrier and in this case imparts a mechanical contact between the semiconductor bodies and the carrier. In other words, the semiconductor bodies of the light-emitting diode chip are fixed, for example, adhesively bonded, to the carrier via the electrically insulating connector. The electrically insulating connector electrically decouples the carrier and the semiconductor bodies from one another. Furthermore, the electrically insulating connector produces a mechanical connection between the semiconductor bodies and the carriers which can be released again only with destruction of the light-emitting diode chip.

The semiconductor bodies may be electrically connected in series with one another at least in part. That is to say that at least some of the semiconductor bodies may be connected to one another to result in a series circuit of individual light-emitting diodes formed by the semiconductor bodies. In this case, it is possible for at least two strings of series-connected semiconductor bodies of the light-emitting diode chip to connect in parallel with one another or in anti-parallel with respect to one another. In an extreme case, only two of the semiconductor bodies of the light-emitting diode chip connect in series with one another.

The light-emitting diode chip may comprise at least two semiconductor bodies, wherein each semiconductor body may comprise at least one active region configured to generate radiation, a carrier having a top side and an underside facing away from the top side, and an electrically insulating connector arranged at the top side of the carrier, wherein the electrically insulating connector is arranged between the semiconductor bodies and the top side of the carrier, the electrically insulating connector imparts a mechanical contact between the semiconductor bodies and the carrier, and at least some of the semiconductor bodies electrically connect in series with one another.

In the case of the light-emitting diode chip described here, the semiconductor bodies among one another and also the semiconductor bodies with respect to the carrier are electrically isolated from one another, for example, by the electrically insulating connector. This advantageously has the result that a short circuit between the carrier and metallizations of the light-emitting diode chip, for example, to connect the semiconductor bodies in series, are prevented by the electrically insulating connector. The disadvantage of a light-emitting diode chip described here, namely that the electrically insulating connector generally has a poor thermal conductivity and, therefore, makes it more difficult to dissipate heat from the semiconductor bodies toward the carrier can be minimized by using particularly thin layers for the electrically insulating connector.

The light-emitting diode chip may comprise exactly two contact locations to electrically contact all the semiconductor bodies. That is to say that contact locations are arranged, for example, on the top side of the electrically insulating connector facing away from the carrier, by which contact locations the light-emitting diode chip can be contacted externally. In this case, the light-emitting diode chip can comprise exactly two contact locations having opposite polarities, by which contact can be made with the light-emitting diode chip on the n-side and p-side such that all the active regions of the semiconductor bodies of the light-emitting diode chip are energized.

The semiconductor bodies of the light-emitting diode chip may be free of a growth substrate. That is to say that the semiconductor bodies in this case may consist of epitaxially grown semiconductor material, wherein the growth substrate is removed from the epitaxially grown semiconductor material. The semiconductor bodies then preferably have a thickness of at most 20 µm, for example, 10 µm or less. The carrier forms a mechanical stabilization for the semiconductor bodies of the light-emitting diode chip.

Each semiconductor body may have a radiation exit area through which radiation generated during operation in at least one active region assigned to the semiconductor body leaves the semiconductor body in a manner directed in a direction away from the carrier. That is to say that the radiation exit area may be formed by an outer area of the semiconductor bodies which does not face the carrier.

A current distribution that energizes the active region may be effected below the radiation exit area. In particular, in this case the radiation exit area is not covered with current distribution structures, such as, for example, with thin conductor tracks composed of a metal or a transparent conductive oxide. Electromagnetic radiation which leaves a semiconductor body through the radiation exit area is therefore not reflected or absorbed at structures for current distribution. Such a light-emitting diode chip is distinguished by a particularly high efficiency.

At least one of the semiconductor bodies, for example, all the semiconductor bodies, may comprise at least one via extending from that side of the semiconductor body facing the top side of the carrier through the at least one active region to an n-conducting region of the semiconductor body. In this case, the via is configured to energize the n-conducting region. That is to say that the current required for operation is fed to the n-conducting region which is arranged, for example, at a side of the active region of the semiconductor body and faces away from the carrier, through the via. In this way, the current distribution that energizes the active region can be effected below the radiation exit area of the semiconductor body. In this case, the via can be arranged at an edge of the semiconductor body. Furthermore, it is possible for the via to be surrounded completely by the semiconductor material of the semiconductor body in a lateral direction that is the directions perpendicular to the growth direction of the semiconductor bodies which run, for example, parallel to a main extension plane of the carrier.

The via may comprise an electrically conducting material electrically isolated from a p-conducting region of the semiconductor body and from the at least one active region by the electrically insulating connector. That is to say that the via is formed with an electrically conducting material which is a metal, for example, which is electrically insulated from the p-conducting region of the semiconductor body facing the carrier, for example, and the at least one active region by the electrically insulating connector. In this case, the electrically insulating connector performs a further task in the light-emitting diode chip: alongside its property as mechanical connection between semiconductor bodies and carrier and its property of electrically decoupling semiconductor bodies and carrier, it serves as part of the via that ensures electrical insulation with respect to parts of the semiconductor body. The light-emitting diode chip may thus be distinguished by a particularly simple construction.

In this case, it is also possible, in particular, for the vias to be filled with the electrically insulating connector at least in places. In other words, the electrically insulating connector copies that topography of the semiconductor body which faces the carrier and therefore also fills the vias. It can then be in the shape of a truncated cone, for example, in the region of the vias.

At least two adjacent semiconductor bodies of the light-emitting diode chip may connect to one another by an electrical connector. For this purpose, the electrical connector is arranged between at least two adjacent semiconductor bodies, wherein the electrical connector electrically conductively connects the p-conducting region of one semiconductor body to the n-conducting region of the other semiconductor body. In other words, the two semiconductor bodies connect in series with one another by the electrical connector. For this purpose, the electrical connector is arranged, for example, at the top side of the carrier, for example, at the top side of the electrically insulating connector facing away from the carrier, between two directly adjacent semiconductor bodies. In this case, the electrical connector can be formed with a metal and/or an electrically conducting oxide (TCO—Transparent Conductive Oxide). By way of example, the electrical connector then consists of ITO (indium tin oxide) or, in particular doped, ZnO.

An electrically insulating layer may be arranged between the top side of the carrier and the electrically insulating connector, wherein the electrically insulating layer is planar. In this case, "planar" means that the electrically insulating layer has no depressions, elevations or roughenings within the scope of production tolerance. The electrically insulating layer can serve for additional electrical isolation between the semiconductor bodies and an electrically conducting carrier. By way of example, the electrically insulating layer is formed with one of the following materials, that is to say that it can consist of one of the following materials or contain one of the following materials: $SiO_2$, $SiN_x$, $Al_2O_3$, $TiO_2$.

In this case, it is possible for the electrically insulating layer to directly adjoin the carrier and the electrically insulating material.

The light-emitting diode chip can be operated with a voltage of at least 6 volts. A value of approximately 6 volts corresponds to a series connection of two light-emitting diode chips. That is to say that the light-emitting diode chip described here is then a so-called "high-voltage" light-emitting diode chip. Such a high-voltage light-emitting diode chip can be connected via a rectifier, for example, directly to the AC voltage power supply system having a voltage of 110 or 230 volts if the forward voltage is chosen to be appropriately high and/or an appropriate number of light-emitting diode chips connect in series. In this case, the light-emitting diode chip described here is distinguished by its simple construction and its robustness owing to the use of the electrically insulating connector.

The light-emitting diode chip described here is explained in greater detail below on the basis of examples and with reference to the associated figures.

In conjunction with FIGS. 1, 2, 3 and 4, different examples of a light-emitting diode chip described here are explained in greater detail with reference to schematic sectional illustrations.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size to enable better illustration and/or to afford a better understanding.

FIG. 1 shows a schematic sectional illustration of a light-emitting diode chip in accordance with a first example. The light-emitting diode chip comprises, for example, a multiplicity of semiconductor bodies 1. Two semiconductor bodies 1a, 1b are illustrated schematically in FIG. 1. Each semiconductor body 1a, 1b comprises an n-conducting region 10, a p-conducting region 12 and an active region 11 configured to generate radiation, the active region being arranged between the n-conducting region 10 and the p-conducting region 12. Each semiconductor body 1a, 1b furthermore comprises a radiation exit area 15. In this case, the radiation exit area 15 is roughened to improve coupling-out efficiency. The radiation exit area 15 is the outer area of the n-conducting region 10 facing away from the active region 11. During operation of the light-emitting diode chip, electromagnetic radiation generated in the active region 11 emerges from the semiconductor body 1 at least partly through the radiation exit area 15 of the semiconductor body 1.

The radiation exit area 15 and side areas of the semiconductor body 1a, 1b are covered by the radiation-transmissive passivation layer 17 which can be formed with silicon dioxide, for example. The passivation layer 17 serves to electrically and chemically passivate the semiconductor body 1.

A mirror 16 containing silver, for example, is arranged at that side of the semiconductor body 1 facing away from the radiation exit area 15. The mirror 16 reflects electromagnetic radiation generated in the active region 11 during operation in the direction of the radiation exit area 15. Furthermore, the mirror 16 serves as a contact layer via which an electric current is impressed into the semiconductor body 1.

A p-type metallization 18 is arranged at that side of the mirror 16 facing away from the semiconductor body 1, the metallization being electrically conductively connected to a contact location 4a of the light-emitting diode chip or an adjacent semiconductor body. In this case, the p-type metallization 18 electrically conductively connects electrically conductively to the contact location 4a which forms a p-side contact for the light-emitting diode chip. In this case, the contact location 4a is arranged in a manner spaced apart from the semiconductor body 1a in a lateral direction 1.

The light-emitting diode chip furthermore comprises a contact location 4b to contact the light-emitting diode chip on the n-side, the contact location being electrically conductively connected to the n-conducting region of the semiconductor body 1b.

In this case, both contact locations 4a, 4b can be arranged at that side of the light-emitting diode chip at which the radiation exit area 15 is situated. Therefore, contact is made with the light-emitting diode chip exclusively from the side of the radiation exit area 15.

The light-emitting diode chip furthermore comprises an electrically insulating connector 3, which, with respect to the carrier 2, at least indirectly produces a mechanical contact between the semiconductor bodies 1a, 1b and the carrier 2. In this case, "indirectly" means that, as illustrated in FIG. 1, at least one further layer, a solder layer 21, can be arranged between the electrically insulating connector 3 and top side 2a of the carrier 2.

The electrically insulating connector 3 imparts a mechanical contact between the carrier and the semiconductor bodies 1a, 1b of the light-emitting diode chip. Furthermore, the electrically insulating connector 3 insulates the semiconductor bodies 1, 1a among one another and from the carrier 2 or the solder layer 21.

The semiconductor bodies 1a, 1b arranged adjacent to one another on the carrier 2 connect in series with one another. This is achieved via the electrical connector 5 arranged at the top side of the electrically insulating connector 3 facing away from the carrier 2. The electrical connector 5 contacts the n-conducting region 10 of at least one of the semiconductor bodies 1a, 1b of the light-emitting diode chip, that is to say from the side of the radiation exit area 15.

In this case, the electrical connector 5 can be formed with a metal or a transparent conductive oxide.

In the example in FIG. 1, contact structures for the current spreading of the impressed electric current over the entire n-conducting region 10 can be arranged at the radiation exit area 15.

A rear-side metallization 22 is arranged at that side of the carrier 2 facing away from the semiconductor bodies 1a, 1b, the rear-side metallization, for example, fixing the light-emitting diode chip by soldering.

The carrier 2 itself can be, as described above, electrically conducting or electrically insulating.

The light-emitting diode chip described in conjunction with FIG. 1 can be produced, for example, as follows.

The semiconductor bodies 1a, 1b are initially present in a wafer compound structure, that is to say are not yet separated from one another.

The mirror 16 can be applied onto the semiconductor bodies 1a, 1b in a structured manner onto the p-conducting side.

The p-type metallization 18 is subsequently applied onto the side facing away from the semiconductor bodies 1a, 1b, the p-type metallization projecting beyond the semiconductor bodies 1a, 1b in a lateral direction 1 at least at one location. As illustrated in FIG. 1, the p-type metallization 18 covers the mirror 16 at the side areas thereof and thus constitutes an encapsulation of the mirror 16 against oxidation and/or the penetration of moisture, for example.

In a next method step, the electrically insulating connector is applied over the whole area onto the underside of the compound structure of the semiconductor bodies, the underside later facing away from the carrier 2.

Subsequently, the carrier 2 is fixed to the electrically insulating connector 3, for example, by adhesive bonding or bonding by the solder layer 21 and the growth substrate is detached from the semiconductor bodies 1a, 1b. Furthermore, the radiation exit area 15 of the semiconductor bodies 1a, 1b can be roughened. The bonding is preceded or succeeded by separation of the individual semiconductor bodies 1a, 1b, for example, by a mesa etch and application of the passivation layer 17.

In a next step, the passivation layer 17 is opened and the contact locations 4a, 4b and the electrical connector 5 are applied. The electrical connector 5 can be produced, for example, by photolithographic patterning of a metal layer.

The contact locations 4a, 4b and the electrical connector 5 can be formed by relatively thin layers of conductive material since the total current intensity applied to the light-emitting diode chip is only 1/n of the total current intensity in the semiconductor bodies 1a, 1b on account of the series connection of the semiconductor bodies, where n is the number of semiconductor bodies connected in series with one another. In this way, it is possible to minimize the shading and the radiation absorption in the region of the contact locations 4a, 4b and of the electrical connector 5.

Figure 2:
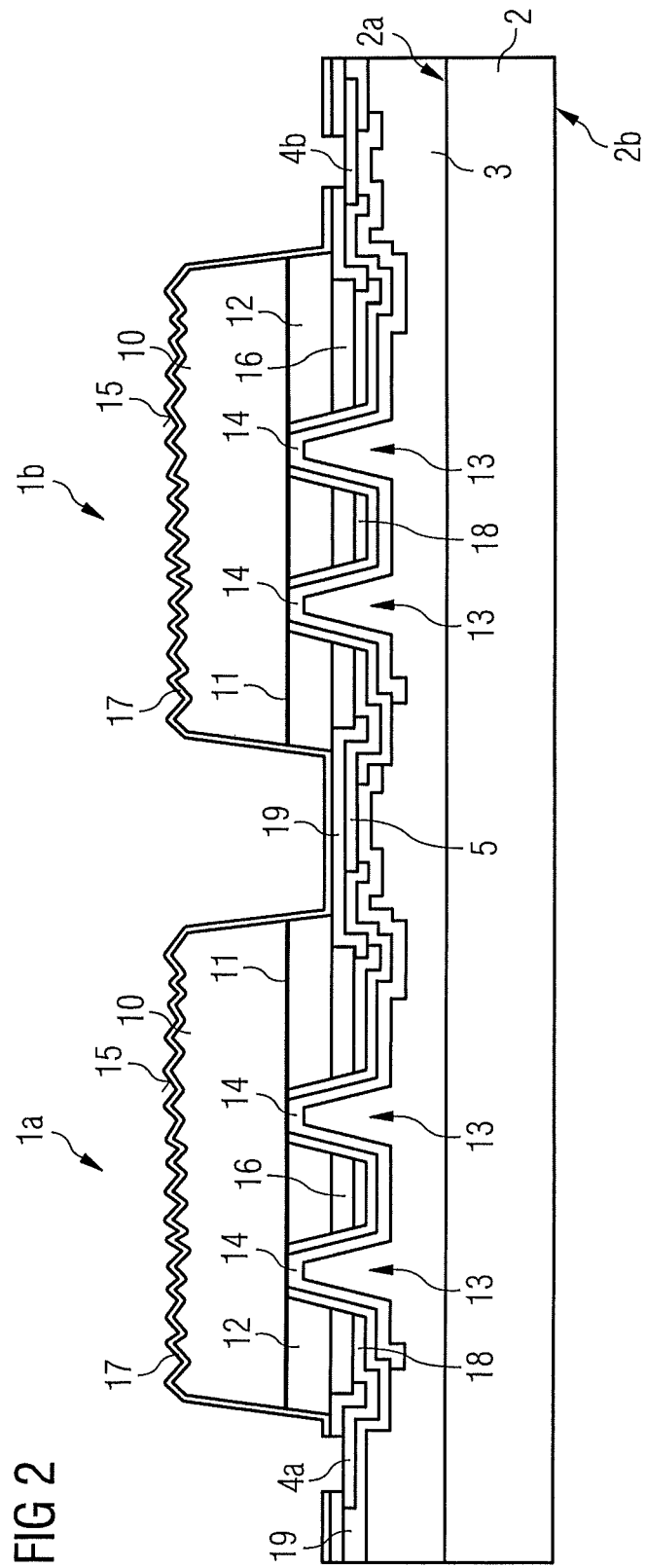
FIG. 2 shows a schematic sectional illustration of a light-emitting diode chip in accordance with a second example.

A further example of a light-emitting diode chip is explained in greater detail in conjunction with the schematic sectional illustration in FIG. 2. In contrast to the example in FIG. 1, a current distribution that operates the active regions 11 of the semiconductor bodies 1a, 1b in this example is effected via the vias 13. The vias 13 extend from the p-conducting region 12 of each semiconductor body 1a, 1b facing the carrier through the p-conducting region 12 and the active region 11 as far as the n-conducting region 10. Electrical contact is made with the n-conducting region 10 by the vias 13.

In the example in FIG. 2, the vias 13 for this purpose comprise an electrically conducting material 14 which can contain silver, for example, and likewise serves as a mirror for the electromagnetic radiation generated in the active region during operation of the light-emitting diode chip. An electrically insulating separating layer 19, which can be formed with silicon dioxide, for example, is formed between the semiconductor body 1 and the electrically conducting material 14. Furthermore, the light-emitting diode chip comprises a further electrically insulating separating layer 19 which covers the side areas of the mirror 16 and encapsulates the mirror 16 in this way.

The electrical connector 5 is furthermore covered, at the side facing away from the carrier 2, by an electrically insulating separating layer 19 and the passivation layer 17. The passivation layer 17 and the electrically insulating separating layer 19 are removed in the region of the contact locations 4a, 4b.

In this case, the electrically insulating connector 3 is in direct contact with the carrier 2, which, by way of example, is likewise electrically insulating. The electrically insulating connector 3 is relatively thick in the example in FIG. 2.

In this case, the electrically insulating connector 3 has a thickness of at most 10 μm, e.g., at most 3 μm, in particular at most 1 μm.

The electrically insulating connector 3, at its surface facing away from the carrier 2, partly or completely copies that surface of the semiconductor bodies 1a, 1b and of the electrical connector 5 facing the carrier 2, and that surface of the electrically insulating connector 3 facing the carrier 2 is planar within the scope of production tolerance. Consequently, the electrically insulating connector 3 also serves for planarization toward the carrier 2.

A further example of a light-emitting diode chip is explained in greater detail in conjunction with the schematic sectional illustration in FIG. 3. In contrast to the example in FIG. 2, the electrically insulating connector 3 in this example does not completely cover the top side of the carrier facing the semiconductor bodies 1a, 1b. Rather, the electrically insulating connector 3 does not cover the electrically conducting material 14 in places. Therefore, in places the electrically conducting material 14 is in direct contact with an electrically insulating layer 6, which completely covers the top side 2a of the carrier 2 facing the semiconductor bodies 1a, 1b. In this case, the electrically insulating layer 6 is planar within the scope of production tolerance. This measure makes it possible for the electrically insulating connector 3 to be particularly thin, in contrast to the example in FIG. 2 such that the heat dissipation from the semiconductor bodies 1a, 1b to the carrier 2 is scarcely adversely influenced by the electrically insulating connector 3. By way of example, a carrier having good electrical and thermal conductivity can be used as the carrier 2.

A further example of a light-emitting diode chip described here is explained in greater detail in conjunction with the schematic sectional illustration in FIG. 4. In contrast to the example in FIG. 3, the electrically insulating separating layer 19 for insulating the vias 13 is dispensed with in this example. Rather, the electrically insulating connector 3 performs electrical insulation of the electrically conducting material 14 from the rest of the semiconductor body. For this purpose, the via 13 is arranged at the edge of each semiconductor body 1a, 1b such that the via 13 is not completely enclosed by the semiconductor material of the semiconductor body in a lateral direction 1.

Similar contact-making is specified in a different context in DE 102010013494.5, the subject matter of which is hereby incorporated by reference.

In the example in FIG. 4, it is advantageously possible to dispense with the electrically insulating separating layer 19 in the region of the vias 13, which further simplifies production of the light-emitting diode chip.

In all examples described here, it is possible for the passivation layer 17 and/or the electrically insulating separating layer 19, which electrically insulate the p-n bridges, that is to say the electrically insulating connector 5, from the semiconductor bodies 1, to act as an encapsulation of the p-side mirror 16 and/or of further p-side metal layers against environmental influences, in particular against moisture. For this purpose, by drawing back the p-side mirror 16, for example, it is possible to produce a hollow groove which is then filled with dielectric material, for example, by an ALD process. The dielectric layer deposited in this case simultaneously guarantees the necessary electrical insulation of the p-n bridges 5.

Our light-emitting diodes are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A light-emitting diode chip comprising:
   at least two semiconductor bodies, each semiconductor body comprising at least one active region that generates radiation,
   a carrier having a top side and an underside facing away from the top side,
   an electrically insulating connector arranged at the top side of the carrier, and
   at least one semiconductor body comprising at least one via which extends from a side of the semiconductor body facing the top side of the carrier through the at least one active region to an n-conducting region of the semiconductor body and the via energizes the n-conducting region,
   wherein
   the electrically insulating connector is arranged between the semiconductor bodies and the top side of the carrier,
   the electrically insulating connector imparts a mechanical contact between the semiconductor bodies and the carrier,
   at least some of the semiconductor bodies electrically connect in series with one another,
   the via comprises an electrically conducting material electrically isolated from a p-conducting region of the semiconductor body and from the at least one active region,
   the via is filled with the electrically insulating connector at least in places so that the electrically insulating connector copies a topography of the semiconductor body facing the carrier,
   the electrically insulating connector has a planar surface facing the carrier so that the insulating connector serves for planarization toward the carrier, and
   a planar electrically insulating layer is arranged between the top side of the carrier and the electrically insulating connector.

2. The light-emitting diode chip according to claim 1, wherein the electrically insulating layer directly adjoins the carrier and the electrically insulating connector.

3. The light-emitting diode chip according to claim 2, wherein the electrically insulating connector, at a surface facing away from the carrier, copies a surface of the semiconductor bodies and of another electrical connector, said surface facing the carrier, and a surface of the electrically insulating connector which faces the electrically insulating layer is planar, and a via extending from a side of the semiconductor body facing the top side of the carrier through the at least one active region to an n-conducting region of the semiconductor body is filled with the electrically insulating connector.

4. The light-emitting diode chip according to claim 1 having exactly two contact locations to make electrical contact with all the semiconductor bodies.

5. The light-emitting diode chip according to claim 1, wherein the semiconductor bodies are free of a growth substrate.

6. The light-emitting diode chip according to claim 1, wherein each semiconductor body has a radiation exit area through which radiation generated during operation in the at least one active region assigned to the semiconductor body leaves the semiconductor body in a manner directed in a direction away from the carrier, and a current distribution that energizes the active region is effected exclusively below the radiation exit area.

7. The light-emitting diode chip according to claim 1, wherein another electrical connector is arranged between at least two adjacent semiconductor bodies, the another electrical connector electrically conductively connecting a p-conducting region of one semiconductor body to an n-conducting region of another semiconductor body.

8. The light-emitting diode chip according to claim 7, wherein the another electrical connector is formed with at least one of a metal and an electrically conducting oxide.

9. The light-emitting diode chip according to claim 1, which can be operated with a voltage of at least 6 V.

10. The light-emitting diode chip according to claim 1, wherein another electrical connector contacts an n-conducting region of at least one of the semiconductor bodies of the light-emitting diode chip from a side of a radiation exit area.

11. The light-emitting diode chip according to claim 1, wherein the electrically insulating connector at a surface facing away from the carrier, partly or completely copies a surface of the semiconductor bodies and another electrical connector, said surface facing the carrier, and a surface of the electrically insulating connector facing the carrier is planar.

12. The light-emitting diode chip according to claim 1, wherein each semiconductor body comprises at least a via extending from a side of the semiconductor body facing the top side of the carrier through the at least one active region to an n-conducting region of the semiconductor body and the via is arranged at an edge of the semiconductor body such that the via is not completely enclosed by the semiconductor body in a lateral direction.

13. The light-emitting diode chip according to claim 1, wherein the electrically insulating connector does not completely cover the top side of the carrier facing the semiconductor bodies.

14. A light-emitting diode chip comprising:
- at least two semiconductor bodies, each semiconductor body comprising at least one active region that generates radiation,
- a carrier having a top side and an underside facing away from the top side, and
- an electrically insulating connector arranged at the top side of the carrier,
- at least one semiconductor body comprising at least one via extending from a side of the semiconductor body facing the top side of the carrier through the at least one active region to an n-conducting region of the semiconductor body and the via energizes the n-conducting region, wherein
- the electrically insulating connector is arranged between the semiconductor bodies and the top side of the carrier,
- the electrically insulating connector imparts a mechanical contact between the semiconductor bodies and the carrier,
- at least some of the semiconductor bodies electrically connect in series with one another,
- the via comprises an electrically conducting material electrically isolated from a p-conducting region of the semiconductor body and from the at least one active region,
- the via is filled with the electrically insulating connector at selected locations such that the electrically insulating connector copies a topography of the semiconductor body facing the carrier,
- wherein the electrically insulating connector fills the via such that the electrically insulating connector is shaped as a truncated cone in a region of the via, and
- the electrically insulating connector has a planar surface facing the carrier so that the insulating connector serves for planarization toward the carrier.

15. The light-emitting diode chip according to claim 1, wherein the electrically insulating connector fills the via such that the electrically insulating connector is shaped as a truncated cone in the region of the via.

* * * * *